United States Patent
Wang

(10) Patent No.: US 10,230,253 B2
(45) Date of Patent: Mar. 12, 2019

(54) POWER SYSTEM FOR MULTI-VOLTAGE LEVELS

(71) Applicant: LEADOT INNOVATION, INC., Kaohsiung (TW)

(72) Inventor: Justin Wang, Taipei (TW)

(73) Assignee: LEADOT INNOVATION, INC., Kaohsiung (TW)

(*) Notice: Subject to any disclaimer, the term of this patent is extended or adjusted under 35 U.S.C. 154(b) by 598 days.

(21) Appl. No.: 14/931,855

(22) Filed: Nov. 4, 2015

(65) Prior Publication Data
US 2016/0365740 A1    Dec. 15, 2016

(30) Foreign Application Priority Data

Jun. 15, 2015 (TW) .............................. 104119233 A

(51) Int. Cl.
| | | |
|---|---|---|
| H02J 1/00 | (2006.01) | |
| H02J 7/00 | (2006.01) | |
| B60L 11/18 | (2006.01) | |
| H03K 17/687 | (2006.01) | |
| H02J 1/08 | (2006.01) | |

(52) U.S. Cl.
CPC ......... *H02J 7/0063* (2013.01); *B60L 11/1855* (2013.01); *H02J 7/0024* (2013.01); *H03K 17/687* (2013.01); *H02J 1/08* (2013.01); *H02J 7/0014* (2013.01); *H02J 2001/008* (2013.01); *Y02T 10/7005* (2013.01); *Y02T 10/705* (2013.01)

(58) Field of Classification Search
CPC .................................................... H02J 7/0063

USPC .................................................. 320/121, 135
See application file for complete search history.

(56) References Cited

U.S. PATENT DOCUMENTS

| | | |
|---|---|---|
| 5,506,456 A | 4/1996 | Yang |
| 2003/0071523 A1 | 4/2003 | Silverman |
| 2007/0273325 A1 | 11/2007 | Krieger |
| 2009/0079384 A1 | 3/2009 | Harris |
| 2009/0286149 A1 | 11/2009 | Ci |
| 2010/0261048 A1* | 10/2010 | Kim ..................... H01M 10/44 429/150 |
| 2011/0130721 A1 | 6/2011 | Foster |
| 2012/0274140 A1 | 11/2012 | Ganor |
| 2014/0210405 A1 | 7/2014 | Yang |

FOREIGN PATENT DOCUMENTS

| | | |
|---|---|---|
| CN | 1536730 A | 10/2004 |
| CN | 201797338 U | 4/2011 |
| CN | 102522795 A | 6/2012 |

(Continued)

*Primary Examiner* — Richard V Muralidar
(74) *Attorney, Agent, or Firm* — Winston Hsu

(57) ABSTRACT

Power system includes a power connector, a voltage detecting unit, a cell array, and a micro-controller unit. The power connector is used for providing at least one output voltage. The voltage detecting unit is coupled to the power connector for detecting voltage levels of at least one output voltage. The cell array is coupled to the power connector for providing energy of at least one output voltage. The cell array includes M cell packs coupled in parallel. Each cell pack includes six transistors and a power storage unit. The micro-controller unit is coupled to the voltage detecting unit and the cell array for controlling each transistor in all cell packs.

5 Claims, 15 Drawing Sheets

(56) References Cited

FOREIGN PATENT DOCUMENTS

| | | |
|---|---|---|
| CN | 103534859 A | 1/2014 |
| JP | H06284586 A | 10/1994 |
| JP | 2004254490 A | 9/2004 |
| JP | 201145183 A | 3/2011 |
| TW | M385858 U1 | 8/2010 |
| TW | 201427227 A | 7/2014 |
| TW | I455444 B | 10/2014 |

* cited by examiner

POWER SYSTEM FOR MULTI-VOLTAGE LEVELS

BACKGROUND OF THE INVENTION

1. Field of the Invention

The present invention illustrates a power system, and more particularly, a power system for inputting multi-voltage levels and/or outputting multi-voltage levels.

2. Description of the Prior Art

With the advancement of techniques, several portable electronic devices are widely adopted to our daily life, such as smart phone, personal digital assistant, tablet, micro-digital camera, and notebook. These portable electronic devices take advantage in high flexibility and high convenience. Specifically, in order to achieve high operation performance, enhancing a processing speed (i.e., floating processing speed) in conjunction with multi-functional processing core becomes a major trend of circuit design. However, with the improvement of processing speed, power consumption of the portable electronic device must be increased accordingly. Thus, when a capacity of a battery (or say, cell packs) is constrained to satisfy a microminiaturization volume, a working time (life span) of the portable electronic device may be reduced.

To extend the working time (life span) of the portable electronic device, a method is to use a power bank. Particularly, the power bank can be regarded as a portable battery with high capacity. By using the power bank to charge the portable electronic device, the working time (life span) of the portable electronic device can be extended. According to a standard of the power bank, an output voltage is fixed to 5V. An output current is fixed to 1 A or 2 A. Thus, the portable electronic device can be charged by using the standard power bank. However, the conventional power bank may not be able to charge another portable electronic device (i.e., smart phone or notebook) designed by a different standard because it may require a different charging voltage. In other words, the conventional power bank may not be compatible to the portable electronic device designed by a different standard. Further, a cell array of the conventional power bank is generally connected in series. Thus, when a cell (or some cells) of the cell array is abnormal, the output voltage becomes unstable, making the power bank unsafe.

Thus, it is important to develop a safe power system capable of inputting and/or outputting voltages with multi-voltage levels.

SUMMARY OF THE INVENTION

In an embodiment of the present invention, a power system is disclosed. The power system includes a power connector, a voltage detecting unit, a cell array, and a micro-controller. The power connector is used for providing at least one output voltage. The voltage detecting unit is coupled to the power connector for detecting voltage levels of the at least one output voltage. The cell array is coupled to the power connector for providing energy of the at least one output voltage. The cell array includes M cell packs coupled in parallel. Each cell pack includes a first transistor, a second transistor, a third transistor, a fourth transistor, a fifth transistor, a power storage unit, and a sixth transistor. The first transistor includes a first terminal, a control terminal for receiving a first control signal, and a second terminal. The second transistor includes a first terminal coupled to the first terminal of the first transistor, a control terminal for receiving a second control signal, and a second terminal. The third transistor includes a first terminal, a control signal for receiving a third control signal, and a second terminal coupled to the second terminal of the second transistor. The fourth transistor includes a first terminal coupled to a second high voltage terminal, a control terminal for receiving a fourth control signal, and a second terminal coupled to the second terminal of the first transistor. The fifth transistor includes a first terminal coupled to the second terminal of the fourth transistor, a control terminal for receiving a fifth control signal, and a second terminal. The power storage unit includes a first terminal coupled to the second terminal of the fifth transistor and a second terminal coupled to the second terminal of the third transistor. The sixth transistor includes a first terminal coupled to the second terminal of the power storage unit, a control unit for receiving a sixth control signal, and a second terminal coupled to a second low voltage terminal. The micro-controller is coupled to the voltage detecting unit and the cell array for controlling each transistor of the M cell packs of the cell array. M is a positive integer greater than 1.

In another embodiment of the present invention, a power system is disclosed. The power system includes a power connector, a voltage detecting unit, a cell array, and a micro-controller. The power connector is used for receiving at least one input voltage. The voltage detecting unit is coupled to the power connector for detecting voltage levels of the at least one input voltage. The cell array is coupled to the power connector for saving energy of the at least one input voltage. The cell array includes M cell packs coupled in parallel. Each cell pack includes a first transistor, a second transistor, a third transistor, a fourth transistor, a fifth transistor, a power storage unit, and a sixth transistor. The first transistor includes a first terminal, a control terminal for receiving a first control signal, and a second terminal. The second transistor includes a first terminal coupled to the first terminal of the first transistor, a control terminal for receiving a second control signal, and a second terminal. The third transistor includes a first terminal, a control signal for receiving a third control signal, and a second terminal coupled to the second terminal of the second transistor. The fourth transistor includes a first terminal coupled to a second high voltage terminal, a control terminal for receiving a fourth control signal, and a second terminal coupled to the second terminal of the first transistor. The fifth transistor includes a first terminal coupled to the second terminal of the fourth transistor, a control terminal for receiving a fifth control signal, and a second terminal. The power storage unit includes a first terminal coupled to the second terminal of the fifth transistor and a second terminal coupled to the second terminal of the third transistor. The sixth transistor includes a first terminal coupled to the second terminal of the power storage unit, a control unit for receiving a sixth control signal, and a second terminal coupled to a second low voltage terminal. The micro-controller is coupled to the voltage detecting unit and the cell array for controlling each transistor of the M cell packs of the cell array. M is a positive integer greater than 1.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
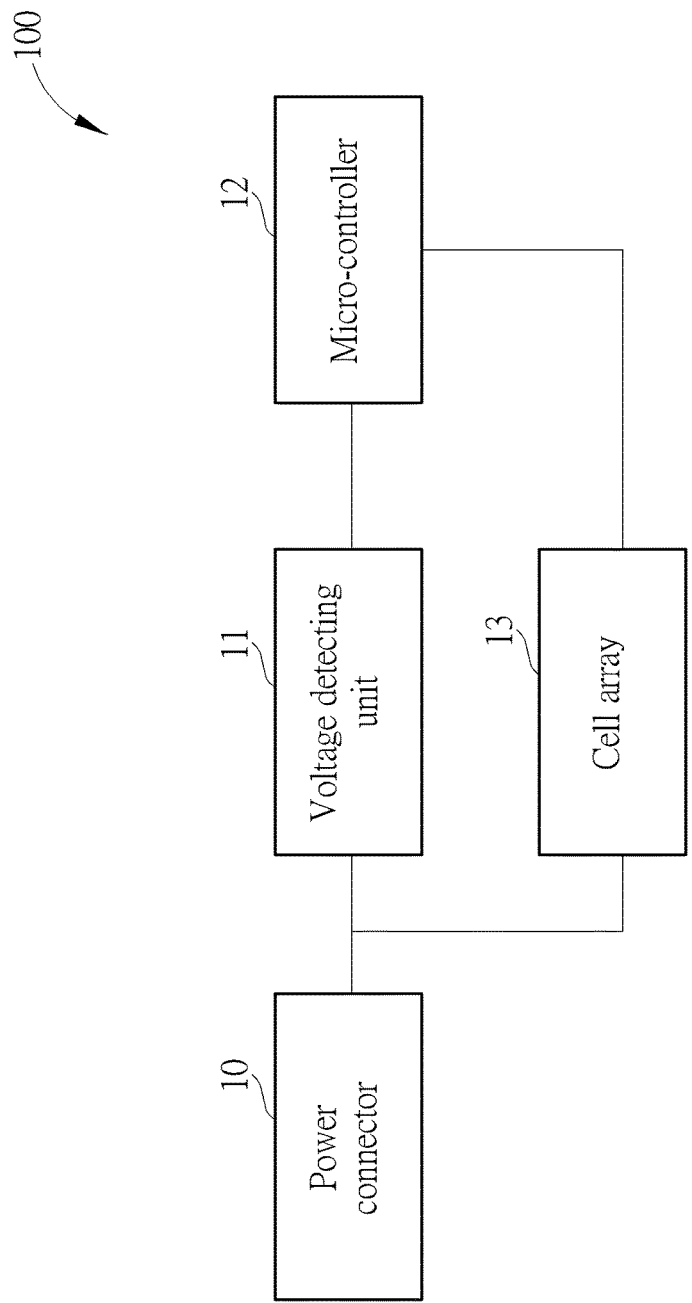
FIG. 1 illustrates a block diagram of a power system according to an embodiment of the present invention.

FIG. 1 illustrates a block diagram of a power system 100 according to an embodiment of the present invention. As shown in FIG. 1, the power system 100 includes a power connector 10, a voltage detecting unit 11, a cell array 13, and a micro-controller 12. The power connector 10 includes Q output terminals. The Q output terminals are used to output at least one output voltage. Here, Q is a positive integer greater than 1. The voltage detecting unit 11 is coupled to the power connector 10 for detecting voltage levels of the at least one output voltage. The cell array 13 is coupled to the power connector 10 for providing energy of the at least one output voltage. The micro-controller 12 is coupled to the voltage detecting unit 11 and the cell array 13 for controlling the cell array 13. In the power system 100, the micro-controller 12 can be any type of processor, such as an embedded processing chip, CPU or logical control unit. The cell array 13 includes power storage units. The power storage units can be any type of power storage units, such as batteries, capacitors, or lithium polymer cells. When a charging line of an electronic device is coupled to the power connector 10 by a user, the voltage detecting unit 11 can detect a standard voltage level of the electronic device. Then, the voltage detecting unit 11 transmits a message (or say, information) of the standard voltage level to the micro-controller 12. After the micro-controller 12 receives the message of the standard voltage level, the micro-controller 12 controls electrical connections of the power storage units of the cell array 13. By doing so, the power system 100 can provide an appropriate standard voltage level for charging various electronic devices, thereby achieving high compatibility. A circuit structure of the cell array 13 of the power system 100 is illustrated below.

Figure 2:
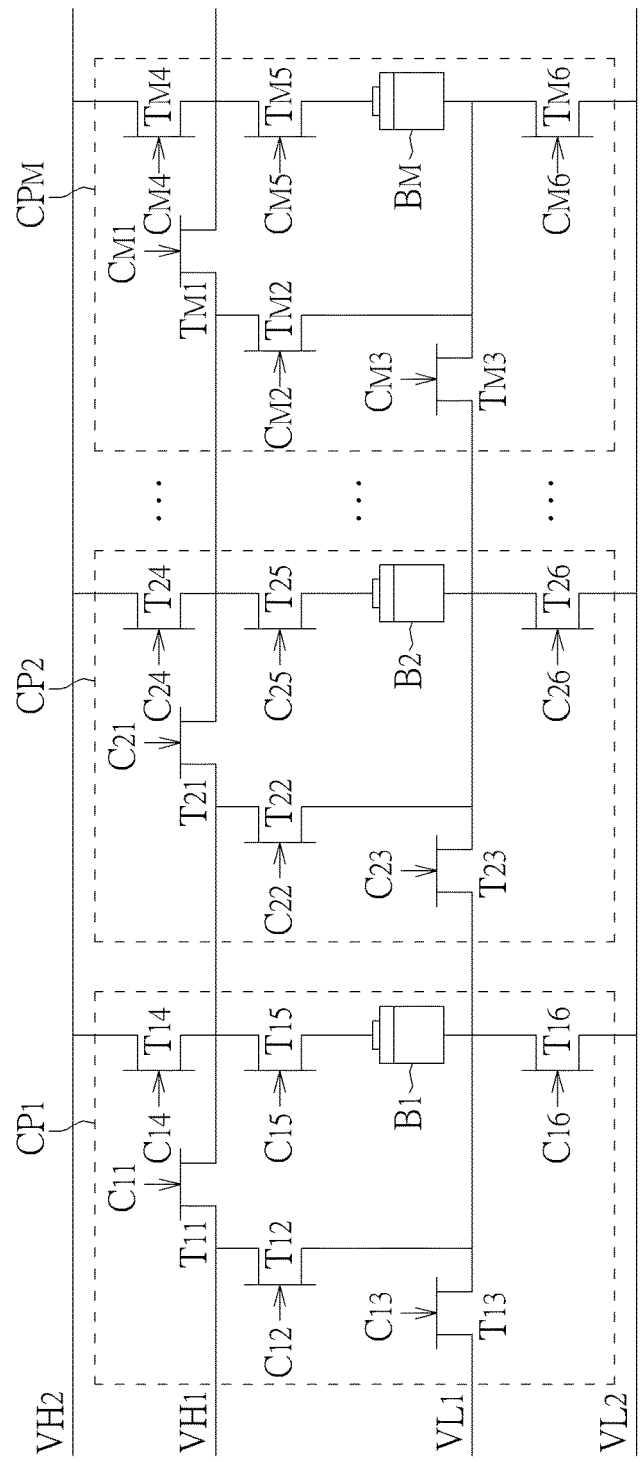
FIG. 2 illustrates a circuit structure of a cell array of the power system in FIG. 1.

FIG. 2 illustrates a circuit structure of the cell array 13 of the power system 100. As shown in FIG. 2, the cell array 13 includes M cell packs $CP_1$ to $CP_M$ (i.e., a range of dotted line). The M cell packs $CP_1$ to $CP_M$ are coupled in parallel. The first cell pack $CP_1$ includes a first transistor $T_{11}$, a second transistor $T_{12}$, a third transistor $T_{13}$, a fourth transistor $T_{14}$, a fifth transistor $T_{15}$, a sixth transistor $T_{16}$, and a power storage unit $B_1$. The first transistor $T_{11}$ includes a first terminal coupled to a first high voltage terminal $VH_1$, a control terminal for receiving a first control signal $C_{11}$, and a second terminal. The second transistor $T_{12}$ includes a first terminal coupled to the first terminal of the first transistor $T_{11}$, a control terminal for receiving a second control signal $C_{12}$, and a second terminal. The third transistor $T_{13}$ includes a first terminal coupled to a first low voltage terminal $VL_1$, a control signal for receiving a third control signal $C_{13}$, and a second terminal coupled to the second terminal of the second transistor $T_{12}$. The fourth transistor $T_{14}$ includes a first terminal coupled to a second high voltage terminal $VH_2$, a control terminal for receiving a fourth control signal $C_{14}$, and a second terminal coupled to the second terminal of the first transistor $T_{11}$. The fifth transistor $T_{15}$ includes a first terminal coupled to the second terminal of the fourth transistor $T_{14}$, a control terminal for receiving a fifth control signal $C_{15}$, and a second terminal. The power storage unit $B_1$ includes a first terminal coupled to the second terminal of the fifth transistor $T_{15}$, and a second terminal coupled to the second terminal of the third transistor $T_{13}$. The sixth transistor $T_{16}$ includes a first terminal coupled to the second terminal of the power storage unit $B_1$, a control unit for receiving a sixth control signal $C_{16}$, and a second terminal coupled to a second low voltage terminal $VL_2$. The second cell pack $CP_2$ includes a first transistor $T_{21}$, a second transistor $T_{22}$, a third transistor $T_{23}$, a fourth transistor $T_{24}$, a fifth transistor $T_{25}$, a sixth transistor $T_{26}$, and a power storage unit $B_2$. The difference between the first cell pack $CP_1$ and the second cell pack $CP_2$ is that the first terminal of the first transistor $T_{21}$ of the second cell pack $CP_2$ is coupled to a second terminal of the fourth transistor $T_{14}$ of the first cell pack $CP_1$. The first terminal of the third transistor $T_{23}$ of the second cell pack $CP_2$ is coupled to the second terminal of the power storage unit $B_1$ of the first cell pack $CP_1$. Similarly, an $m^{th}$ cell pack $CP_m$ includes 6 transistors $T_{m1}$ to $T_{m6}$ and a power storage unit $B_m$. Particularly, a first terminal of a first transistor $T_{m1}$ of the $m^{th}$ cell pack $CP_m$ is coupled to a second terminal of a fourth transistor $T_{(m-1)4}$ of an $(m-1)^{th}$ cell pack $CP_{m-1}$. A first terminal of a third transistor $T_{m3}$ of the $m^{th}$ cell pack $CP_m$ is coupled to a second terminal of a power storage unit $B_{m-1}$ of the $(m-1)^{th}$ cell pack $CP_{m-1}$. Here, m is a positive integer and $2 \le m \le M$. Similarly, an $M^{th}$ cell pack $CP_M$ includes 6 transistors $T_{M1}$ to $T_{M6}$ and a power storage unit $B_M$. A first terminal of a first transistor $T_{M1}$ of the $M^{th}$ cell pack $CP_M$ is coupled to a second terminal of a fourth transistor $T_{(M-1)4}$ of an $(M-1)^{th}$ cell pack $CP_{M-1}$. A first terminal of a third transistor $T_{M3}$ of the $M^{th}$ cell pack $CP_M$ is coupled to a second terminal of a power storage unit $B_{M-1}$ of the $(M-1)^{th}$ cell pack $CP_{M-1}$. In the embodiment, each transistor of the first cell pack $CP_1$ to the $M^{th}$ cell pack $CP_M$ can be an N-type metal-oxide-semiconductor or a P-type metal-oxide-semiconductor. All control signals of the first cell pack $CP_1$ to the $M^{th}$ cell pack $CP_M$ can be generated by the micro-controller 12. In other words, the micro-controller 12 can control an ON-state (i.e., a state of enable) and an OFF-state (i.e., a state of disable) of each transistor of the first cell pack $CP_1$ to the $M^{th}$ cell pack $CP_M$. Equivalently, electrical connections of the power storage units $B_1$ to $B_M$ can be adjusted accordingly. In the following, some electrical connections of the power system 100 are illustrated.

Figure 3:
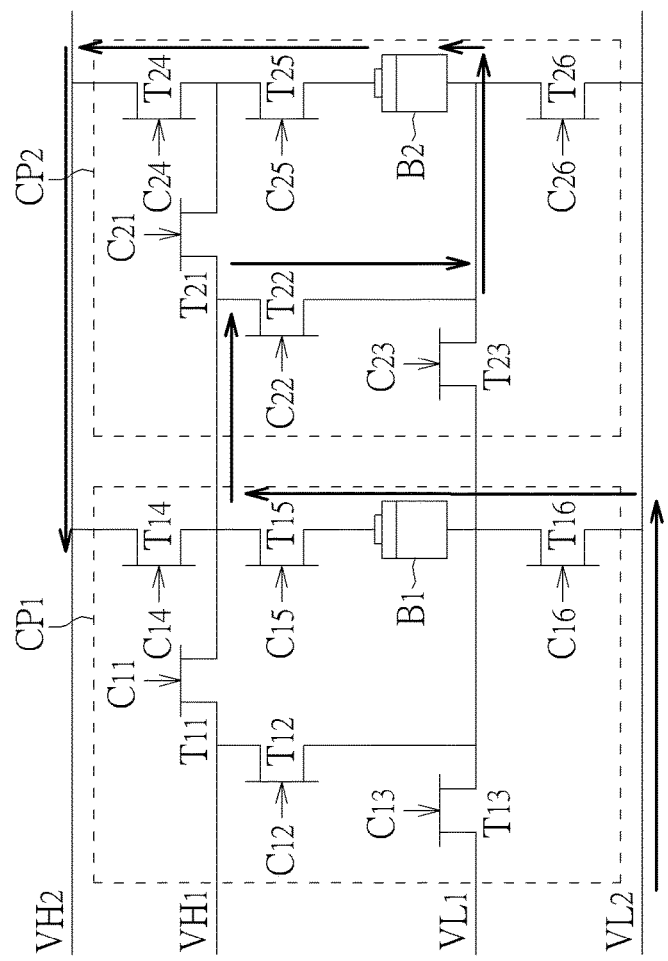
FIG. 3 illustrates a structure of two cell packs coupled in series of the power system in FIG. 1.

FIG. 3 illustrates a structure of two cell packs coupled in series of the power system 100. As shown in FIG. 3, two cell packs $CP_1$ and $CP_2$ are considered. When the micro-controller 12 prepares to control the electrical connections between the power storage unit $B_1$ of the first cell pack $CP_1$ and the power storage unit $B_2$ of the second cell pack $CP_2$ to establish a serial connection, the micro-controller 12 generates control signals $C_{11}$ to $C_{16}$ corresponding to the first cell pack $CP_1$. The micro-controller 12 generates control signals $C_{21}$ to $C_{26}$ corresponding to the second cell pack $CP_2$. Here, the fifth transistor $T_{15}$ and the sixth transistor $T_{16}$ of the first cell pack $CP_1$ are enabled. The first transistor $T_{11}$, the second transistor $T_{12}$, the third transistor $T_{13}$, and the fourth transistor $T_{14}$ of the first cell pack $CP_1$ are disabled. Specifically, the second transistor $T_{22}$, the fourth transistor $T_{24}$, and the fifth transistor $T_{25}$ of the second cell pack $CP_2$ are enabled. The first transistor $T_{21}$, the third transistor $T_{23}$, and the sixth transistor $T_{26}$ of the second cell pack $CP_2$ are disabled. Thus, the power storage unit $B_1$ and the power storage unit $B_2$ establish a serial connection. The current can be outputted to a second high voltage terminal $VH_2$ (i.e., as a direction of arrow with bold line in FIG. 3) through the power storage unit $B_1$ and the power storage unit $B_2$ for charging the electronic device.

Figure 4:
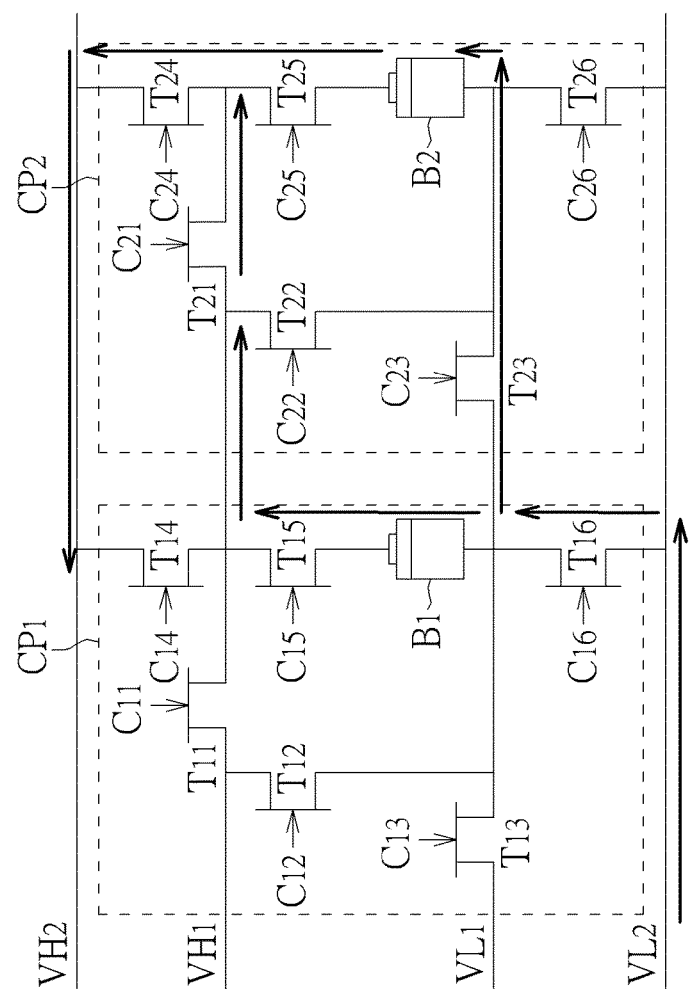
FIG. 4 illustrates a structure of two cell packs coupled in parallel of the power system in FIG. 1.

FIG. 4 illustrates a structure of two cell packs coupled in parallel of the power system 100. As shown in FIG. 3, two cell packs $CP_1$ and $CP_2$ are considered. When the micro-controller 12 prepares to control the electrical connections between the power storage unit $B_1$ of the first cell pack $CP_1$ and the power storage unit $B_2$ of the second cell pack $CP_2$ to establish a parallel connection, the micro-controller 12 generates control signals $C_{11}$ to $C_{16}$ corresponding to the first cell pack $CP_1$. The micro-controller 12 generates control signals $C_{21}$ to $C_{26}$ corresponding to the second cell pack $CP_2$. Here, the fifth transistor $T_{15}$ and the sixth transistor $T_{16}$ of the first cell pack $CP_1$ are enabled. The first transistor $T_{11}$, the second transistor $T_{12}$, the third transistor $T_{13}$, and the fourth transistor $T_{14}$ of the first cell pack $CP_1$ are disabled. Specifically, the first transistor $T_{21}$, the third transistor $T_{23}$, the fourth transistor $T_{24}$, and the fifth transistor $T_{25}$ of the second cell pack $CP_2$ are enabled. The second transistor $T_{22}$ and the sixth transistor $T_{26}$ of the second cell pack $CP_2$ are disabled. Thus, the power storage unit $B_1$ and the power storage unit $B_2$ establish a parallel connection. The current can be outputted to the second high voltage terminal $VH_2$ (i.e., as a direction of arrow with bold line in FIG. 4) through the power storage unit $B_1$ and the power storage unit $B_2$ for charging the electronic device.

Figure 5:
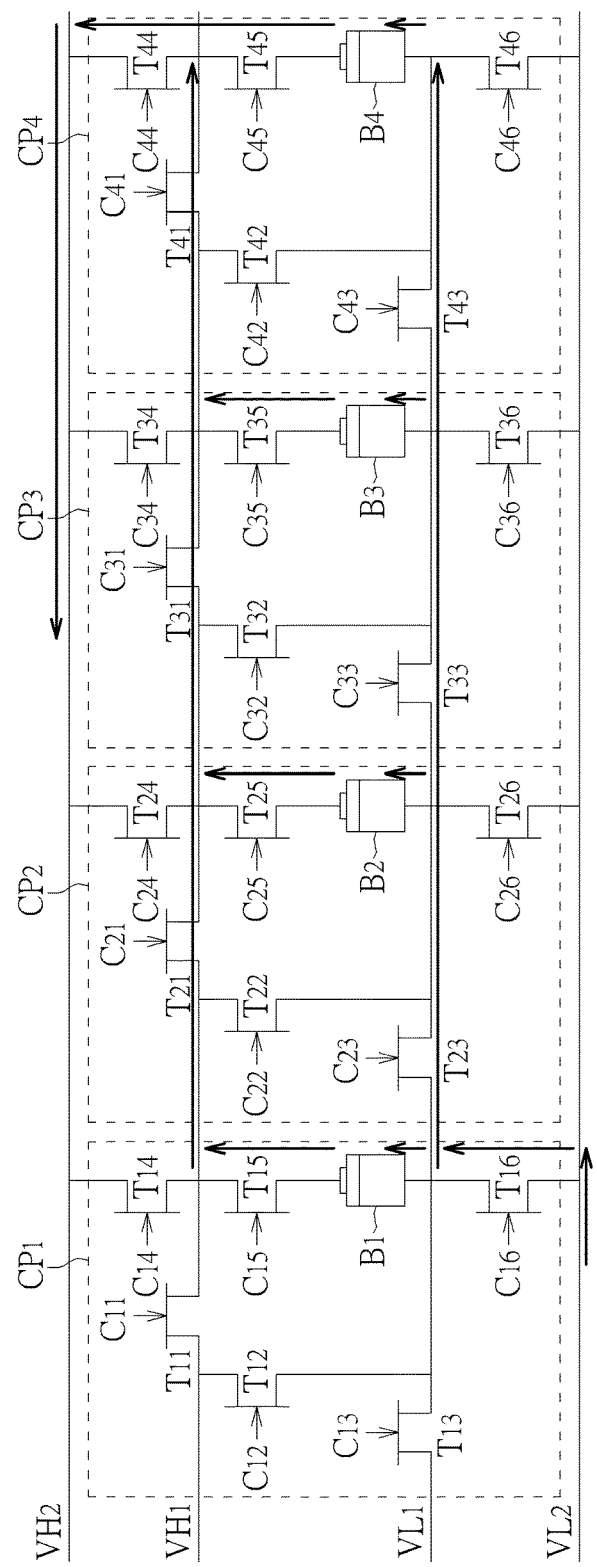
FIG. 5 illustrates a structure of four cell packs coupled in parallel of the power system in FIG. 1.

FIG. 5 illustrates a structure of four cell packs coupled in parallel of the power system 100. As shown in FIG. 5, four cell packs $CP_1$ to $CP_4$ are considered. When the micro-controller 12 prepares to control the electrical connections among the power storage unit $B_1$ of the first cell pack $CP_1$, the power storage unit $B_2$ of the second cell pack $CP_2$, the power storage unit $B_3$ of the third cell pack $CP_3$, and the power storage unit $B_4$ of the fourth cell pack $CP_4$ to establish a parallel connection, the micro-controller 12 generates control signals $C_{11}$ to $C_{16}$ corresponding to the first cell pack $CP_1$. The micro-controller 12 generates control signals $C_{21}$ to $C_{26}$ corresponding to the second cell pack $CP_2$. The micro-controller 12 generates control signals $C_{31}$ to $C_{36}$ corresponding to the third cell pack $CP_3$. The micro-controller 12 generates control signals $C_{41}$ to $C_{46}$ corresponding to the fourth cell pack $CP_4$. Specifically, the fifth transistor $T_{15}$ and the sixth transistor $T_{16}$ of the first cell pack $CP_1$ are enabled. The first transistor $T_{11}$, the second transistor $T_{12}$, the third transistor $T_{13}$, and the fourth transistor $T_{14}$ of the first cell pack $CP_1$ are disabled. The first transistor $T_{21}$, the third transistor $T_{23}$, and the fifth transistor $T_{25}$ of the second cell pack $CP_2$ are enabled. The second transistor $T_{22}$, the fourth transistor $T_{24}$, and the sixth transistor $T_{26}$ of the second cell pack $CP_2$ are disabled. The first transistor $T_{31}$, the third transistor $T_{33}$, and the fifth transistor $T_{35}$ of the third cell pack $CP_3$ are enabled. The second transistor $T_{32}$, the fourth transistor $T_{34}$, and the sixth transistor $T_{36}$ of the third cell pack $CP_3$ are disabled. The first transistor $T_{41}$, the second transistor $T_{42}$, the third transistor $T_{43}$, the fourth transistor $T_{44}$, and the fifth transistor $T_{45}$ of the fourth cell pack $CP_4$ are enabled. The sixth transistor $T_{46}$ of the fourth cell pack $CP_4$ is disabled. Thus, the power storage unit $B_1$, the power storage unit $B_2$, the power storage unit $B_3$, and the power storage unit $B_4$ establish a parallel connection. The current can be outputted to the second high voltage terminal $VH_2$ (i.e., as a direction of arrow with bold line in FIG. 5) through the power storage unit $B_1$, the power storage unit $B_2$, the power storage unit $B_3$, and the power storage unit $B_4$ for charging the electronic device.

Figure 6:
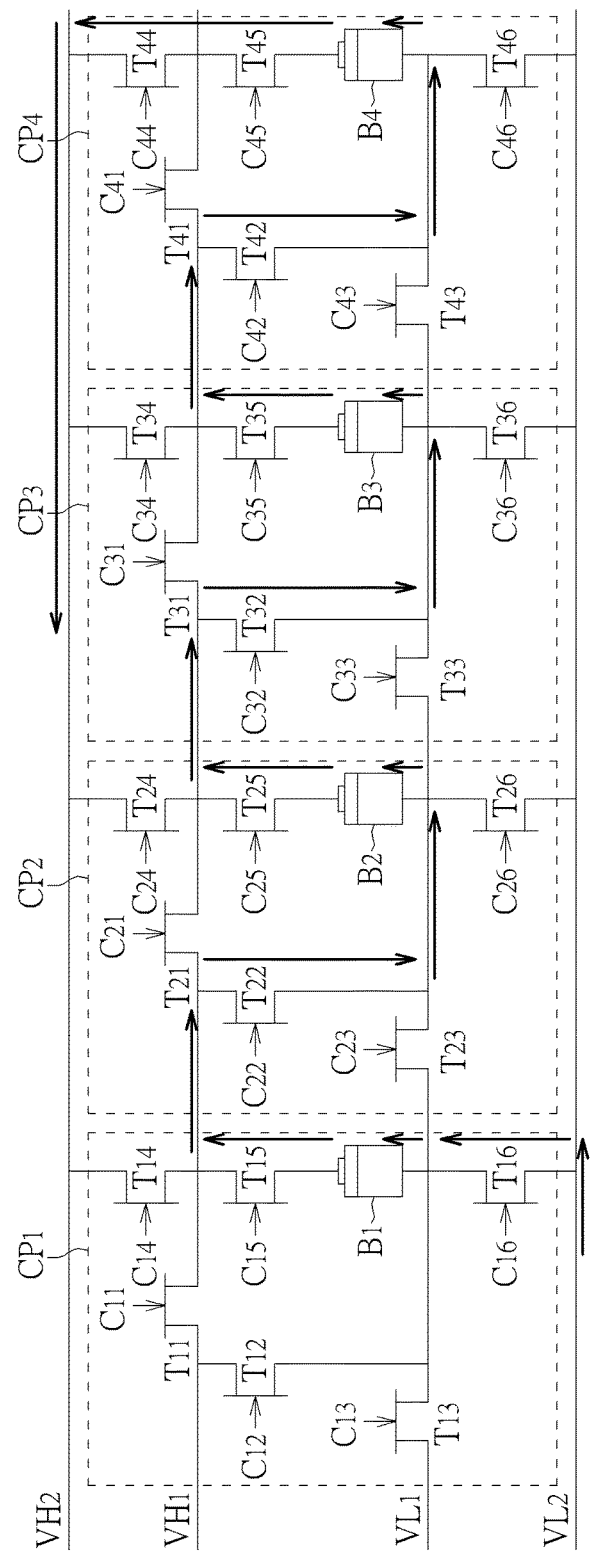
FIG. 6 illustrates a structure of four cell packs coupled in series of the power system in FIG. 1.

FIG. 6 illustrates a structure of four cell packs coupled in series of the power system 100. As shown in FIG. 6, four cell packs $CP_1$ to $CP_4$ are considered. When the micro-controller 12 prepares to control the electrical connections among the power storage unit $B_1$ of the first cell pack $CP_1$, the power storage unit $B_2$ of the second cell pack $CP_2$, the power storage unit $B_3$ of the third cell pack $CP_3$, and the power storage unit $B_4$ of the fourth cell pack $CP_4$ to become serial connection circuits, the micro-controller 12 generates control signals $C_{11}$ to $C_{16}$ corresponding to the first cell pack $CP_1$. The micro-controller 12 generates control signals $C_{21}$ to $C_{26}$ corresponding to the second cell pack $CP_2$. The micro-controller 12 generates control signals $C_{31}$ to $C_{36}$ corresponding to the third cell pack $CP_3$. The micro-controller 12 generates control signals $C_{41}$ to $C_{46}$ corresponding to the fourth cell pack $CP_4$. Specifically, the fifth transistor $T_{15}$ and the sixth transistor $T_{16}$ of the first cell pack $CP_1$ are enabled. The first transistor $T_{11}$, the second transistor $T_{12}$, the third transistor $T_{13}$, and the fourth transistor $T_{14}$ of the first cell pack $CP_1$ are disabled. The second transistor $T_{22}$ and the fifth transistor $T_{25}$ of the second cell pack $CP_2$ are enabled. The first transistor $T_{21}$, the third transistor $T_{23}$, the fourth transistor $T_{24}$, and the sixth transistor $T_{26}$ of the second cell pack $CP_2$ are disabled. The second transistor $T_{32}$ and the fifth transistor $T_{35}$ of the third cell pack $CP_3$ are enabled. The first transistor $T_{31}$, the third transistor $T_{33}$, the fourth transistor $T_{34}$, and the sixth transistor $T_{36}$ of the third cell pack $CP_3$ are disabled. The second transistor $T_{42}$, the fourth transistor $T_{44}$ and the fifth transistor $T_{45}$ of the fourth cell pack $CP_4$ are enabled. The first transistor $T_{41}$, the third transistor $T_{43}$, and the sixth transistor $T_{46}$ of the fourth cell pack $CP_4$ are disabled. Thus, the power storage unit $B_1$, the power storage unit $B_2$, the power storage unit $B_3$, and the power storage unit $B_4$ become serial connection. The current can be outputted to the second high voltage terminal $VH_2$ (i.e., as a direction of arrow with bold line in FIG. 6) through the power storage unit $B_1$, the power storage unit $B_2$, the power storage unit $B_3$, and the power storage unit $B_4$ for charging the electronic device.

Figure 7:
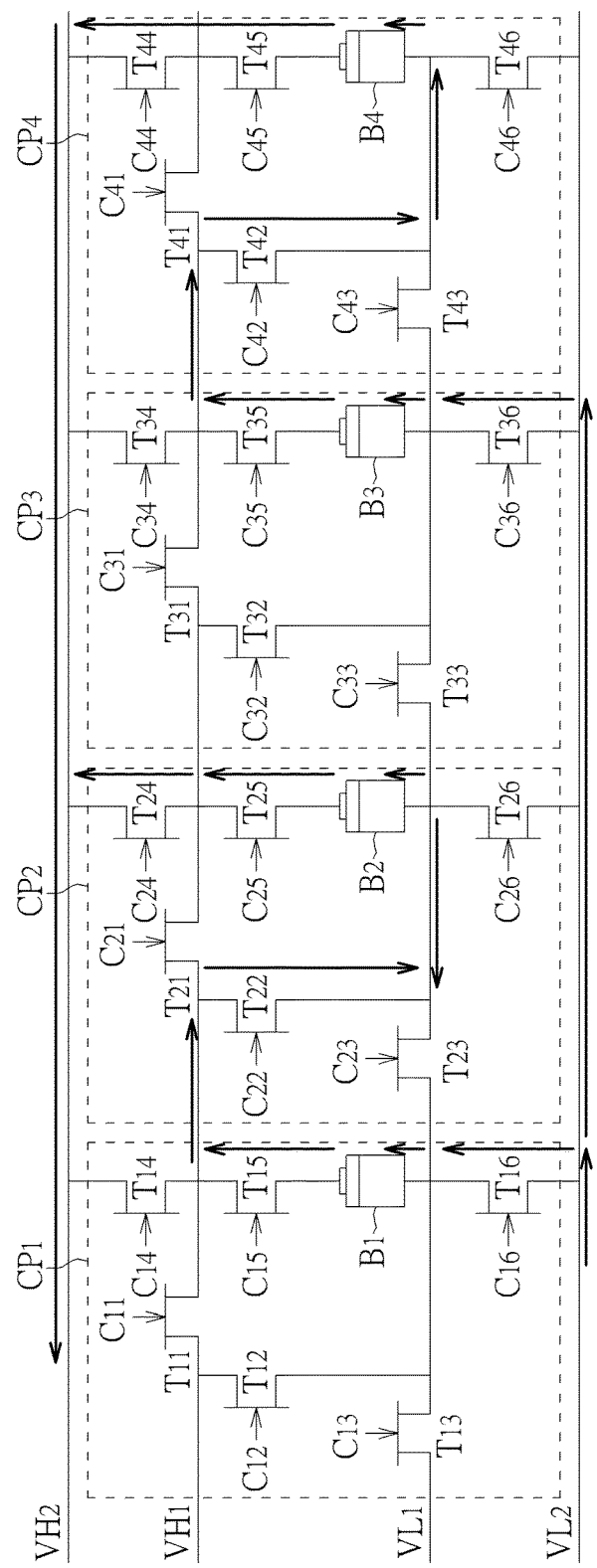
FIG. 7 illustrates a structure of four cell packs with pair-wised coupled in series and then coupled in parallel of the power system in FIG. 1.

FIG. 7 illustrates a structure of four cell packs with pair-wised coupled in series and then coupled in parallel of the power system 100. As shown in FIG. 7, four cell packs $CP_1$ to $CP_4$ are considered. When the micro-controller 12 prepares to control the electrical connections between the power storage unit $B_1$ of the first cell pack $CP_1$ and the power storage unit $B_2$ of the second cell pack $CP_2$ to become a first pair-wised serial connection circuit, and prepares to control the electrical connections between the power storage unit $B_3$ of the third cell pack $CP_3$ and the power storage unit $B_4$ of the fourth cell pack $CP_4$ to become a second pair-wised serial connection circuit, and then coupled two pair-wised serial connection circuits in parallel, the micro-controller 12 generates control signals $C_{11}$ to $C_{16}$ corresponding to the first cell pack $CP_1$. The micro-controller 12 generates control signals $C_{21}$ to $C_{26}$ corresponding to the second cell pack $CP_2$. The micro-controller 12 generates control signals $C_{31}$ to $C_{36}$ corresponding to the third cell pack $CP_3$. The micro-controller 12 generates control signals $C_{41}$ to $C_{46}$ corresponding to the fourth cell pack $CP_4$. Specifically, the fifth transistor $T_{15}$ and the sixth transistor $T_{16}$ of the first cell pack $CP_1$ are enabled. The first transistor $T_{11}$, the second transistor $T_{12}$, the third transistor $T_{13}$, and the fourth transistor $T_{14}$ of the first cell pack $CP_1$ are disabled. The second transistor $T_{22}$, the fourth transistor $T_{24}$, and the fifth transistor $T_{25}$ of the second cell pack $CP_2$ are enabled. The first transistor $T_{21}$, the third transistor $T_{23}$, and the sixth transistor $T_{26}$ of the second cell pack $CP_2$ are disabled. The fifth transistor $T_{35}$ and the sixth transistor $T_{36}$ of the third cell pack $CP_3$ are enabled. The first transistor $T_{31}$, the second transistor $T_{32}$, the third transistor $T_{33}$, and the fourth transistor $T_{34}$ of the third cell pack $CP_3$ are disabled. The second transistor $T_{42}$, the fourth transistor $T_{44}$, and the fifth transistor $T_{45}$ of the fourth cell pack $CP_4$ are enabled. The first transistor $T_{41}$, the third transistor $T_{43}$, and the sixth transistor $T_{46}$ of the fourth cell pack $CP_4$ are disabled. Thus, the power storage unit $B_1$ and the power storage unit $B_2$ become serial connection (i.e., a structure of the first pair-wised serial connection circuit). The power storage unit $B_3$ and the power storage unit $B_4$ become serial connection (i.e., a structure of the second pair-wised serial connection circuit). Particularly, two structures of pair-wised serial connection circuits are coupled in parallel. The current can be outputted to the second high voltage terminal $VH_2$ (i.e., as a direction of arrow with bold line in FIG. 7) through the power storage unit $B_1$, the power storage unit $B_2$, the power storage unit $B_3$, and the power storage unit $B_4$ for charging the electronic device.

Figure 8:
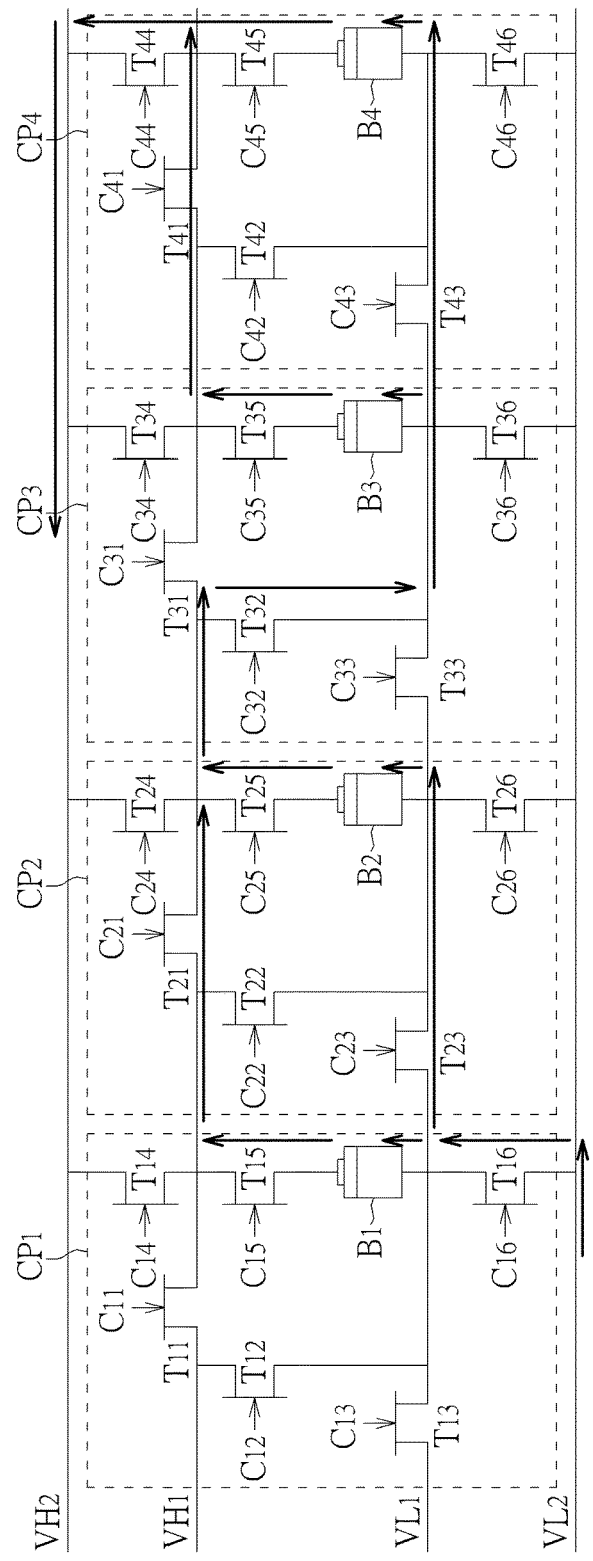
FIG. 8 illustrates a structure of four cell packs with pair-wised coupled in parallel and then coupled in series of the power system in FIG. 1.

FIG. 8 illustrates a structure of four cell packs with pair-wised coupled in parallel and then coupled in series of the power system 100. As shown in FIG. 8, four cell packs $CP_1$ to $CP_4$ are considered. When the micro-controller 12 prepares to control the electrical connections between the power storage unit $B_1$ of the first cell pack $CP_1$ and the power storage unit $B_2$ of the second cell pack $CP_2$ to become a first pair-wised parallel connection circuit, and prepares to control the electrical connections between the power storage unit $B_3$ of the third cell pack $CP_3$ and the power storage unit $B_4$ of the fourth cell pack $CP_4$ to become a second pair-wised parallel connection circuit, and then coupled two pair-wised parallel connection circuits in series, the micro-controller 12 generates control signals $C_{11}$ to $C_{16}$ corresponding to the first cell pack $CP_1$. The micro-controller 12 generates control signals $C_{21}$ to $C_{26}$ corresponding to the second cell pack $CP_2$. The micro-controller 12 generates control signals $C_{31}$ to $C_{36}$ corresponding to the third cell pack $CP_3$. The micro-controller 12 generates control signals $C_{41}$ to $C_{46}$ corresponding to the fourth cell pack $CP_4$. Specifically, the fifth transistor $T_{15}$ and the sixth transistor $T_{16}$ of the first cell pack $CP_1$ are enabled. The first transistor $T_{11}$, the second transistor $T_{12}$, the third transistor $T_{13}$, and the fourth transistor $T_{14}$ of the first cell pack $CP_1$ are disabled. The first transistor $T_{21}$, the third transistor $T_{23}$, and the fifth transistor $T_{25}$ of the second cell pack $CP_2$ are enabled. The second transistor $T_{22}$, the fourth transistor $T_{24}$, and the sixth transistor $T_{26}$ of the second cell pack $CP_2$ are disabled. The second transistor $T_{32}$ and the fifth transistor $T_{35}$ of the third cell pack $CP_3$ are enabled. The first transistor $T_{31}$, the third transistor $T_{33}$, the fourth transistor $T_{34}$, and the sixth transistor $T_{36}$ of the third cell pack $CP_3$ are disabled. The first transistor $T_{41}$, the third transistor $T_{43}$, the fourth transistor $T_{44}$, and the fifth transistor $T_{45}$ of the fourth cell pack $CP_4$ are enabled. The second transistor $T_{42}$ and the sixth transistor $T_{46}$ of the fourth cell pack $CP_4$ are disabled. Thus, the power storage unit $B_1$ and the power storage unit $B_2$ become parallel connection (i.e., a structure of the first pair-wised parallel connection circuit). The power storage unit $B_3$ and the power storage unit $B_4$ become parallel connection (i.e., a structure of the second pair-wised parallel connection circuit). Particularly, two structures of the pair-wised parallel connection circuits are coupled in series. The current can be outputted to the second high voltage terminal $VH_2$ (i.e., as a direction of arrow with bold line in FIG. 8) through the power storage unit $B_1$, the power storage unit $B_2$, the power storage unit $B_3$, and the power storage unit $B_4$ for charging the electronic device.

Figure 9:
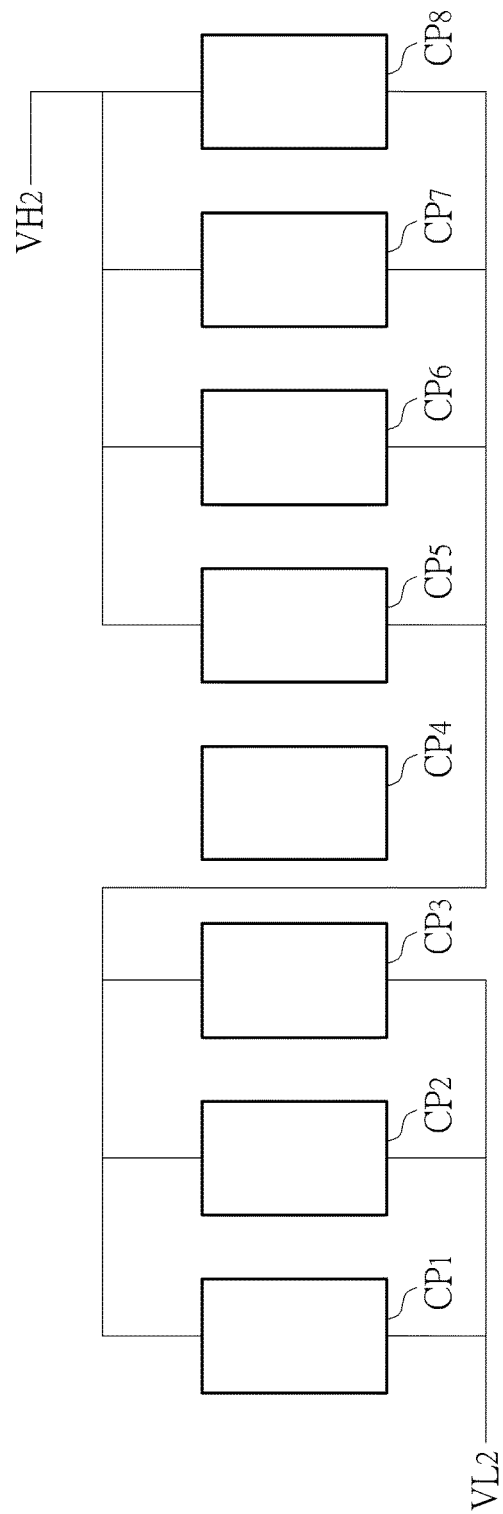
FIG. 9 illustrates a first layout method of eight cell packs of the power system in FIG. 1.

Since the micro-controller 12 can change electrical connections of the M cell packs of the power system 100, the adjustable electrical connections can be applied to avoid some abnormal cell packs (i.e., by floating some abnormal cell packs), thereby improving the operation security level. FIG. 9 illustrates a first layout method of eight cell packs of the power system 100. As shown in FIG. 9, eight cell packs $CP_1$ to $CP_8$ are considered. In FIG. 9, the fourth cell pack $CP_4$ is an abnormal cell pack. If the power system 100 uses the abnormal cell pack $CP_4$, the security level may be reduced. Thus, when the micro-controller 12 controls electrical connections of the cell packs $CP_1$ to $CP_8$, the abnormal cell pack $CP_4$ is rerouted by floating the abnormal cell pack $CP_4$ as an isolated cell pack. In the embodiment, the micro-controller 12 controls electrical connections among the first cell pack $CP_1$, the second cell pack $CP_2$, and the third cell pack $CP_3$ as connection in parallel. The micro-controller 12 controls electrical connections among the fifth cell packs $CP_5$, the sixth cell packs $CP_6$, the seventh cell packs $CP_7$, and the eighth cell packs $CP_8$ as connection in parallel. Specifically, two sets of parallel connection circuits of the cell packs (i.e., a set of cell packs $CP_1$ to $CP_3$, and another set of cell packs $CP_5$ to $CP_8$) are coupled in series. By doing so, after the electrical connections of the cell packs $CP_1$ to $CP_8$ is appropriately adjusted by the micro-controller 12, the abnormal cell pack $CP_4$ becomes a floating cell pack $CP_4$. Equivalently, the abnormal cell pack $CP_4$ is disabled for charging or discharging energy. Thus, the power system 100 can provide high security level.

Figure 10:
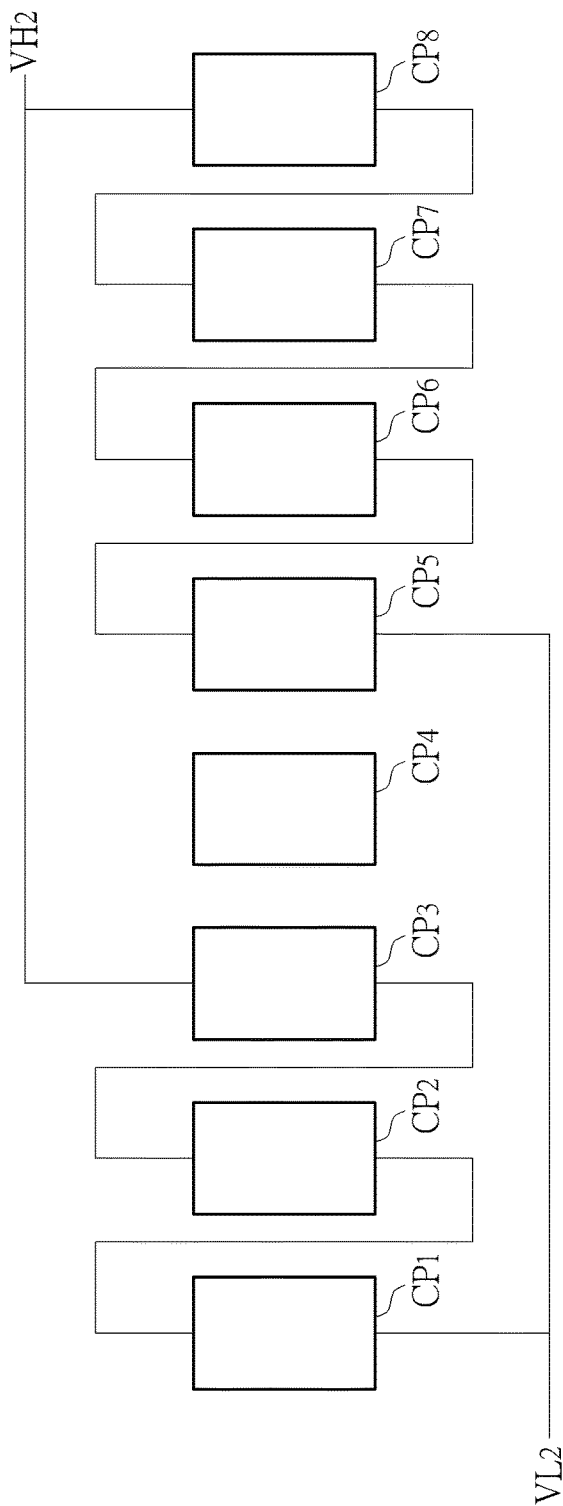
FIG. 10 illustrates a second layout method of eight cell packs of the power system in FIG. 1.

FIG. 10 illustrates a second layout method of eight cell packs of the power system 100. As shown in FIG. 10, eight cell packs $CP_1$ to $CP_8$ are considered. In FIG. 10, the fourth cell pack $CP_4$ is an abnormal cell pack. If the power system 100 uses the abnormal cell pack $CP_4$, the security level is reduced. Thus, when the micro-controller 12 controls electrical connections of the cell packs $CP_1$ to $CP_8$, the abnormal cell pack $CP_4$ is rerouted by floating the abnormal cell pack $CP_4$ as an isolated cell pack. In the embodiment, the micro-controller 12 controls electrical connections among the first cell pack $CP_1$, the second cell pack $CP_2$, and the third cell pack $CP_3$ as connection in series. The micro-controller 12 controls electrical connections among the fifth cell packs $CP_5$, the sixth cell packs $CP_6$, the seventh cell packs $CP_7$, and the eighth cell packs $CP_8$ as connection in series. Specifically, two sets of serial connection circuits of the cell packs (i.e., a set of cell packs $CP_1$ to $CP_3$, and another set of cell packs $CP_5$ to $CP_8$) are coupled in parallel. By doing so, after the electrical connections of the cell packs $CP_1$ to $CP_8$ is appropriately adjusted by the micro-controller 12, the abnormal cell pack $CP_4$ becomes a floating cell pack $CP_4$. Equivalently, the abnormal cell pack $CP_4$ is disabled for charging or discharging energy. Thus, the power system 100 can provide high security level.

Figure 11:
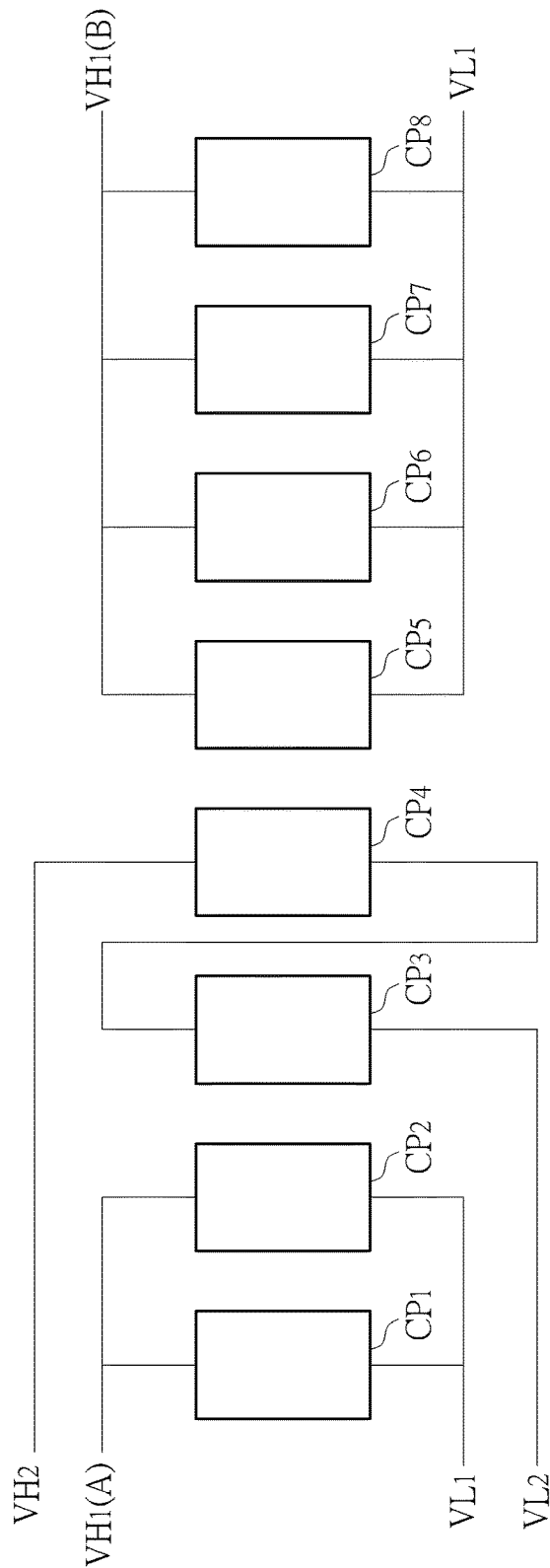
FIG. 11 illustrates a first method for outputting multi-voltage levels by using eight cell packs of the power system in FIG. 1.

As indicated above, the power system 100 can provide high security level. Moreover, the power system 100 can also support multi-voltage levels output. FIG. 11 illustrates a first method for outputting multi-voltage levels by using eight cell packs of the power system 100. As shown in FIG. 11, eight cell packs $CP_1$ to $CP_8$ are considered. In the embodiment, 3 output voltages with different voltage levels can be respectively provided by 3 output terminals of the power connector 10 of the power system 100. In FIG. 11, the first cell pack $CP_1$ and the second cell pack $CP_2$ are coupled in parallel by the micro-controller 12. Thus, a first output terminal of the power connector 10 can be coupled to a low voltage terminal $VL_1$ and a high voltage terminal $VH_1$ (A) for outputting a first voltage level. The third cell pack $CP_3$ and the fourth cell pack $CP_4$ are coupled in series by the micro-controller 12. Thus, a second output terminal of the power connector 10 can be coupled to a low voltage terminal $VL_2$ and a high voltage terminal $VH_2$ for outputting a second voltage level. The fifth cell pack $CP_5$, the sixth cell pack $CP_6$, the seventh cell pack $CP_7$, and the eight cell pack $CP_8$ are coupled in parallel by the micro-controller 12. Thus, a third output terminal of the power connector 10 can be coupled to a low voltage terminal $VL_1$ and a high voltage terminal $VH_1$ (B) for outputting a third voltage level.

Figure 12:
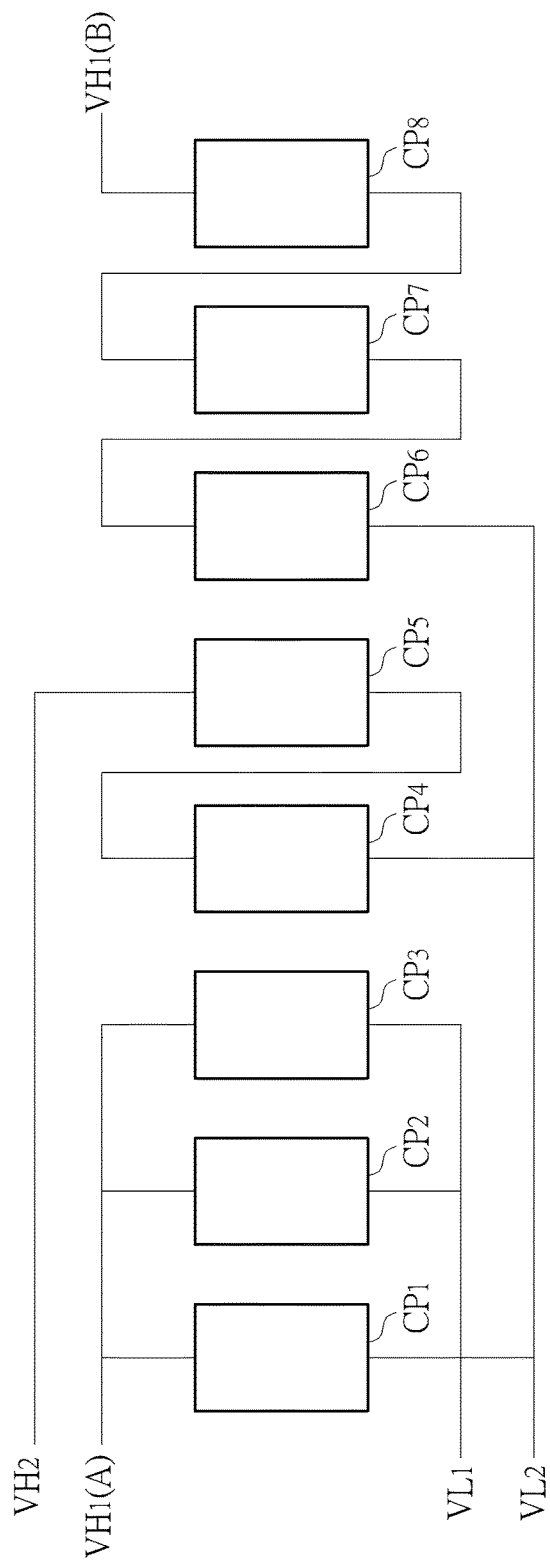
FIG. 12 illustrates a second method for outputting multi-voltage levels by using eight cell packs of the power system in FIG. 1.

FIG. 12 illustrates a second method for outputting multi-voltage levels by using eight cell packs of the power system 100. As shown in FIG. 12, eight cell packs $CP_1$ to $CP_8$ are considered. In the embodiment, 3 output voltages with different voltage levels can be respectively provided by 3 output terminals of the power connector 10 of the power system 100. In FIG. 12, the first cell pack $CP_1$, the second cell pack $CP_2$, and the third cell pack $CP_3$ are coupled in parallel by the micro-controller 12. Thus, a first output terminal of the power connector 10 can be coupled to a low voltage terminal $VL_1$ and a high voltage terminal $VH_1$ (A) for outputting a first voltage level. The fourth cell pack $CP_4$ and the fifth cell pack $CP_5$ are coupled in series by the micro-controller 12. Thus, a second output terminal of the power connector 10 can be coupled to a low voltage terminal $VL_2$ and a high voltage terminal $VH_2$ for outputting a second voltage level. The sixth cell pack $CP_6$, the seventh cell pack $CP_7$, and the eighth cell pack $CP_8$ are coupled in series by the micro-controller 12. Thus, a third output terminal of the power connector 10 can be coupled to a low voltage terminal $VL_2$ and a high voltage terminal $VH_1$ (B) for outputting a third voltage level.

Although the embodiments of the power system 100 in FIG. 11 and FIG. 12 use 8 cell packs $CP_1$ to $CP_8$ to provide 3 different output voltage levels, the present invention is not limited by using 8 cell packs. For example, other embodiments can use any quantity of cell packs for outputting various output voltage levels. Additionally, when each power storage of the M cell packs provides electric energy equal to K volts, the power system 100 supports to provide the electric energy between K volts and (M×K) volts. In the following, energy balance technique is used to the power system 100 by automatically adjusting energy of all cell packs for increasing a life span of the power system 100. The energy balance technique of the power system 100 is illustrated below.

Figure 13:
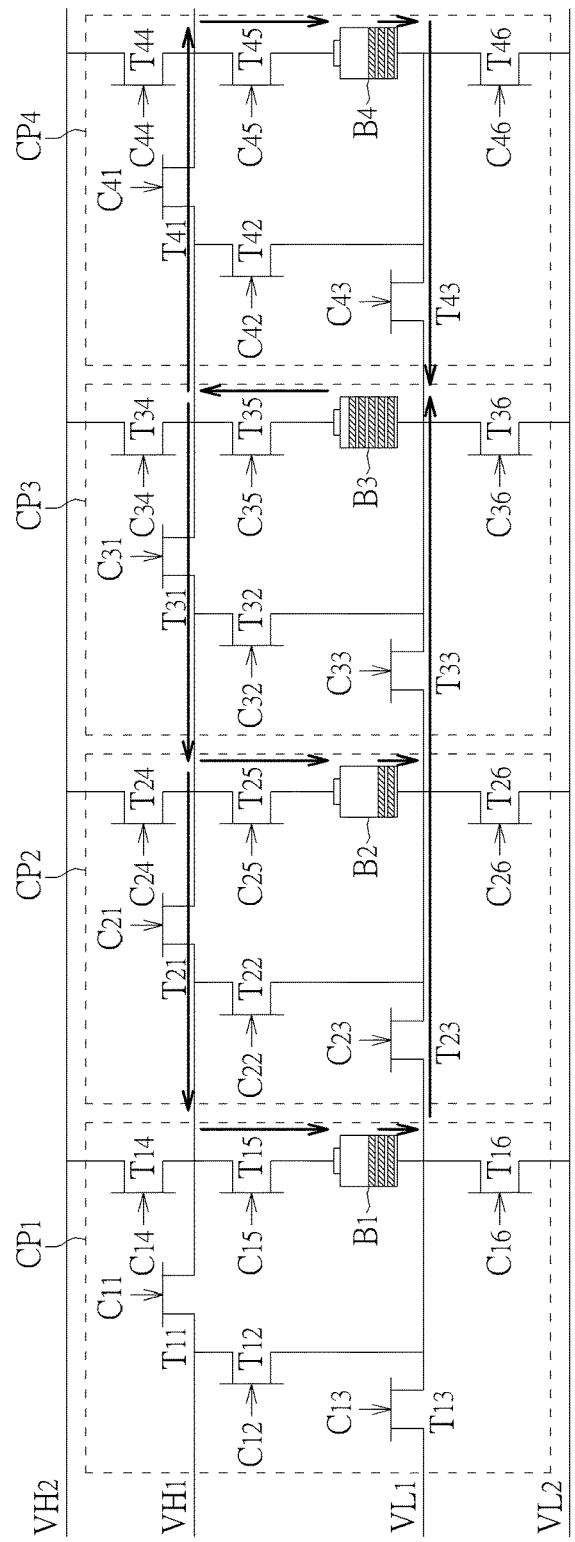
FIG. 13 illustrates an auto-balance energy mechanism of four cell packs of the power system in FIG. 1.

FIG. 13 illustrates an auto-balance energy mechanism of four cell packs of the power system 100. As shown in FIG. 13, four cell packs $CP_1$ to $CP_4$ are considered. Specifically, energy of a power storage unit $B_3$ of the third cell pack $CP_3$ is higher than energy of a power storage unit $B_1$ of the first cell pack $CP_1$, energy of a power storage unit $B_2$ of the second cell pack $CP_2$, and energy of a power storage unit $B_4$ of the fourth cell pack $CP_4$. The idea of auto-balance energy mechanism is to make all cell packs $CP_1$ to $CP_4$ have equal energy. To perform the auto-balance energy mechanism, the micro-controller 12 reforms electrical connections of four cell packs $CP_1$ to $CP_4$ to satisfy a closed-loop connection circuit. In the embodiment, the fifth transistor $T_{15}$ of the first cell pack $CP_1$ is enabled by the micro-controller 12. The first transistor $T_{11}$, the second transistor $T_{12}$, the third transistor $T_{13}$, the fourth transistor $T_{14}$, and the sixth transistor $T_{16}$ of the first cell pack $CP_1$ are disabled by the micro-controller 12. The first transistor $T_{21}$, the third transistor $T_{23}$, and the fifth transistor $T_{25}$ of the second cell pack $CP_2$ are enabled by the micro-controller 12. The second transistor $T_{22}$, the fourth transistor $T_{24}$, and the sixth transistor $T_{26}$ of the second cell pack $CP_2$ are disabled by the micro-controller 12. The first transistor $T_{31}$, the third transistor $T_{33}$, and the fifth transistor $T_{35}$ of the third cell pack $CP_3$ are enabled by the micro-controller 12. The second transistor $T_{32}$, the fourth transistor $T_{34}$, and the sixth transistor $T_{36}$ of the third cell pack $CP_3$ are disabled by the micro-controller 12. The first transistor $T_{41}$, the third transistor $T_{43}$, and the fifth transistor $T_{45}$ of the fourth cell pack $CP_4$ are enabled by the micro-controller 12. The second transistor $T_{42}$, the fourth transistor $T_{44}$, and the sixth transistor $T_{46}$ of the fourth cell pack $CP_4$ are disabled by the micro-controller 12. By doing so, a power storage device $B_1$, a power storage device $B_2$, a power storage device $B_3$, and a power storage device $B_4$ are coupled in parallel and thus form a closed-loop circuit. As a result, the current (energy) is transmitted from the power storage device $B_3$ to the power storage devices $B_1$, $B_2$, and $B_4$. Particularly, since the power storage device $B_1$, the power storage device $B_2$, the power storage device $B_3$, and the power storage device $B_4$ form the closed-loop circuit, when the power system 100 is under steady state, the power storage device $B_1$, the power storage device $B_2$, the power storage device $B_3$, and the power storage device $B_4$ have the same voltage level according to Kirchhoff Circuit Laws. Thus, working time (life span) of the power system 100 can be extended.

Figure 14:
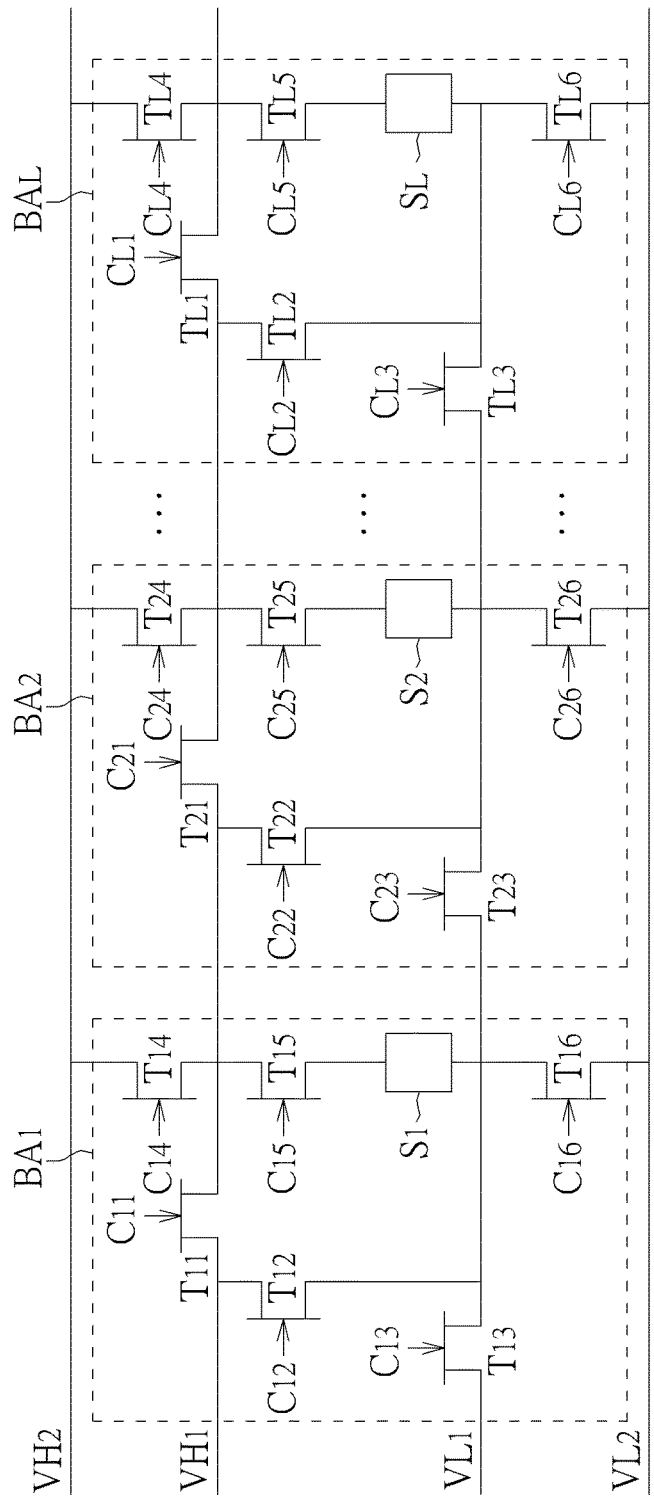
FIG. 14 illustrates a nested structure based cell array of the power system in FIG. 1.

FIG. 14 illustrates a nested structure based cell array of the power system 100. As shown in FIG. 14, a cell array 13 of the power system 100 here is considered as a nested structure based cell array. The nested structure based cell array includes L nested cell packs $BA_1$ to $BA_L$. Here, L is a positive integer greater than 1. A structure of each nested cell pack is similar to a structure of cell pack (or say, a substructure) in above embodiments. Thus, the illustration of the nested cell pack is omitted here. The difference between the nested cell pack and the cell pack is that the nested cell pack includes a power storage device (i.e., or say, a superset power storage unit). The power storage device of the nested cell pack includes M cell packs. For example, a first nested cell pack $BA_1$ includes a power storage device $S_1$. The power storage device $S_1$ includes a first cell pack $CP_1$ to an $M^{th}$ cell pack $CP_M$. A second nested cell pack $BA_2$ includes a power storage device $S_2$. The power storage device $S_2$ includes a first cell pack $CP_1$ to an $M^{th}$ cell pack $CP_M$.

Similarly, an $L^{th}$ nested cell pack $BA_L$ includes a power storage device $S_L$. The power storage device $S_L$ includes a first cell pack $CP_1$ to an $M^{th}$ cell pack $CP_M$. Thus, the micro-controller 12 can control electrical connections of the first nested cell pack $BA_1$ to the $L^{th}$ nested cell pack $BA_L$. The micro-controller 12 can also control electrical connections of the first cell pack $CP_1$ to an $M^{th}$ cell pack $CP_M$ in each nested cell pack. Thus, when each power storage unit of the M cell packs provides an electric energy equal to K volts, the power system supports to provide the electric energy between K volts and (M×L×K) volts. Although the nested structure based cell array 13 of the power system 100 is exemplified as a twice recursive nested cell array (i.e., M cell packs forming a nested cell pack, and L nested cell packs forming a nested structure based cell array), the present invention is not limited by using a specific recursive number of the nested structure based cell array 13. For example, other embodiments of the power system 100 can use a nested structure based cell array 13 with arbitrary recursive number.

Figure 15:
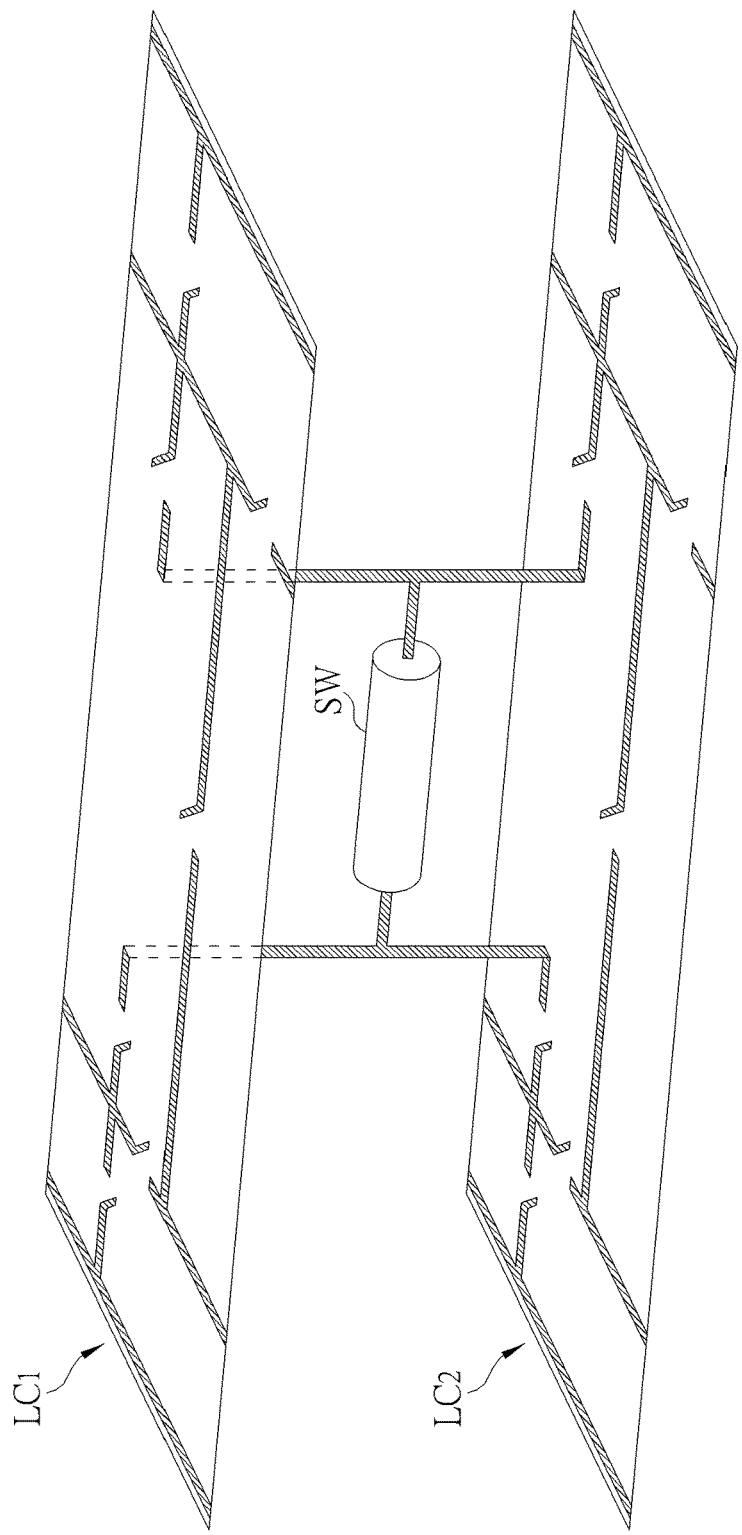
FIG. 15 illustrates a multi-level nested structure based cell array of the power system in FIG. 1.

Besides using a single nested structure based cell array 13 to the power system 100, a multi-level nested structure based cell array is introduced in the following. FIG. 15 illustrates the multi-level nested structure based cell array of the power system 100. As shown in FIG. 15, the nested structure based cell array with two levels is applied to the power system 100. A first level nested structure based cell array $LC_1$ and a second level nested structure based cell array $LC_2$ are coupled each other. A switch SW is used for communicating between the first level nested structure based cell array LC1 and the second level nested structure based cell array LC2. Thus, the micro-controller 12 can control the switch SW for enabling the first level nested structure based cell array $LC_1$ and/or the second level nested structure based cell array $LC_2$ of the power system 100. In other words, When the power system 100 includes a nested structure based cell array 13 with R levels, each level of nested structure based cell array 13 including L nested cell packs, each nested cell pack including M cell packs, and each power storage unit of the M cell packs providing an electric energy equal to K volts, the power system 100 can support to provide the electric energy between K volts and (R×M×L×K) volts. Although the multi-level nested structure based cell array of the power system 100 is exemplified as a two-level nested cell array in FIG. 15, the present invention is not limited by using a nested structure based cell array 13 with fixed number of level. For example, other embodiments of the power system 100 can use a nested structure based cell array 13 with arbitrary number of level. By using multi-level nested structure based cell array, the power system 100 can provide larger dynamic range of output voltage, thereby increasing the compatibility.

In the embodiment of FIG. 11 to FIG. 14, the power system 100 can discharge the energy from some/all power storage units for charging the external electronic device. In other embodiments, the power system 100 can also be charged by an external power supply. Specifically, when the power system 100 is considered as a charging system, the power connector 10 in FIG. 1 includes Q input terminals. The Q input terminals are used to receive at least one input voltage. The cell array 13 is coupled to the power connector 10 for saving energy of the at least one input voltage. However, the structure of the cell array 13, the method for controlling electrical connections of the cell array 13 by the micro-controller 12, and the structure for expanding the cell array 13 to the nested cell pack, the nested structure based cell array, and the multi-level nested structure based cell array are similar to the illustrations in FIG. 2 to FIG. 15. Thus, they are omitted here. Particularly, when the power system 100 is considered as the charging system, all current directions are opposite to the current directions illustrated in FIG. 3 to FIG. 8. As known, the current is transmitted from a high voltage terminal to some/all power storage units for saving energy.

Additionally, the power system 100 of the present invention is not limited by using a plurality of transistors for enabling or disabling a current path. For example, each transistor of the plurality of transistors in the power system 100 can be replaced with any mechanical-type physical switch device or any electromagnetic-type physical switch device.

To sum up, the present invention discloses a power system having a capability of charging energy and/or discharging energy. The idea of design is to use a micro-controller for controlling electrical connections of all cell packs of the power system. By doing so, the power system is capable of inputting and/or outputting voltages with multi-voltage levels. Further, since all electrical connections of all cell packs are adjustable, some abnormal cell packs can be rerouted as floating cell packs, thereby increasing security level. Besides, all power storage units of the cell packs can be performed by an auto-balance energy mechanism. Thus, working time (life span) of the power system can be extended.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A power system, comprising:
  a power connector configured to provide at least one output voltage;
  a voltage detecting unit directly coupled to the power connector and configured to detect voltage levels of the at least one output voltage;
  a cell array directly coupled to the power connector and configured to provide energy of the at least one output voltage, the cell array comprising M cell packs directly coupled in parallel, each cell pack comprising:
    a first transistor comprising:
      a first terminal;
      a control terminal configured to receive a first control signal; and
      a second terminal;
    a second transistor comprising:
      a first terminal directly coupled to the first terminal of the first transistor;
      a control terminal configured to receive a second control signal; and
      a second terminal;
    a third transistor comprising:
      a first terminal;
      a control terminal configured to receive a third control signal; and
      a second terminal directly coupled to the second terminal of the second transistor;
    a fourth transistor comprising:
      a first terminal directly coupled to a second high voltage terminal;
      a control terminal configured to receive a fourth control signal; and a second terminal directly coupled to the second terminal of the first transistor;
a fifth transistor comprising:
a first terminal directly coupled to the second terminal of the fourth transistor;
a control terminal configured to receive a fifth control signal; and
a second terminal;
a power storage unit comprising:
a first terminal directly coupled to the second terminal of the fifth transistor; and
a second terminal directly coupled to the second terminal of the third transistor; and
a sixth transistor comprising:
a first terminal directly coupled to the second terminal of the power storage unit;
a control terminal configured to receive a sixth control signal; and
a second terminal directly coupled to a second low voltage terminal; and
a micro-controller directly coupled to the voltage detecting unit and the cell array and
configured to control each transistor of the M cell packs of the cell array; wherein M is a positive integer greater than 1.

2. The power system of claim 1, wherein the power connector comprises Q output terminals, Q is a positive integer greater than 1, and the Q output terminals are configured to output the at least one output voltage.

3. The power system of claim 1, wherein when each power storage unit of the M cell packs provides electric energy equal to K volts, the power system supports to provide the electric energy between K volts and (M×K) volts.

4. The power system of claim 1, wherein a first terminal of a first transistor of a first cell pack of the M cell packs is coupled to a first high voltage terminal, a first terminal of a third transistor of the first cell pack of the M cell packs is coupled to a first low voltage terminal, a first terminal of a first transistor of an $m^{th}$ cell pack of the M cell packs is coupled to a second terminal of a fourth transistor of an $(m-1)^{th}$ cell pack of the M cell packs, a first terminal of a third transistor of the $m^{th}$ cell pack of the M cell packs is coupled to a second terminal of a power storage unit of the $(m-1)^{th}$ cell pack of the M cell packs, m is a positive integer and $2 \leq m \leq M$.

5. The power system of claim 1, wherein each transistor of the plurality of transistors is an N-type metal-oxide-semiconductor or a P-type metal-oxide-semiconductor.

* * * * *